(12) United States Patent
Tietjen et al.

(10) Patent No.: US 8,234,324 B2
(45) Date of Patent: Jul. 31, 2012

(54) DIFFERENTIAL INVERSE ALIASING DIGITAL TO ANALOG CONVERTER

(75) Inventors: Byron W. Tietjen, Baldwinsville, NY (US); Munroe C. Clayton, Liverpool, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 1086 days.

(21) Appl. No.: 12/136,452

(22) Filed: Jun. 10, 2008

(65) Prior Publication Data

US 2009/0302899 A1 Dec. 10, 2009

(51) Int. Cl.
*G06F 17/10* (2006.01)
(52) U.S. Cl. ...................................... 708/300
(58) Field of Classification Search .................. None
See application file for complete search history.

(56) References Cited

U.S. PATENT DOCUMENTS

| | | |
|---|---|---|
| 4,316,187 A | 2/1982 | Spencer |
| 4,893,316 A | 1/1990 | Janc et al. |
| 5,272,438 A | 12/1993 | Stumme |
| 5,642,052 A | 6/1997 | Earle |
| 5,796,636 A | 8/1998 | Andrews |
| 5,969,516 A | 10/1999 | Wottrich |
| 6,034,726 A | 3/2000 | Hirota et al. |
| 6,054,931 A | 4/2000 | Wottrich |
| 6,072,317 A | 6/2000 | Mackenzie |
| 6,218,844 B1 | 4/2001 | Wong et al. |
| 6,246,225 B1 | 6/2001 | Schaefer |
| 6,462,555 B1 | 10/2002 | Schaefer |
| 6,466,029 B2 | 10/2002 | Stroth et al. |
| 6,781,381 B2 | 8/2004 | Parker |
| 6,785,104 B2 | 8/2004 | Tallman et al. |
| 6,850,073 B2 | 2/2005 | Elms et al. |
| 7,106,071 B2 | 9/2006 | Pharn et al. |
| 7,116,111 B2 | 10/2006 | Wyar |
| 7,123,899 B1 | 10/2006 | Chen et al. |
| 7,141,960 B2 | 11/2006 | Bystrom |
| 7,173,428 B2 | 2/2007 | Hurwicz |
| 7,221,283 B1 | 5/2007 | Czarnecki |
| 7,236,338 B2 | 6/2007 | Hale et al. |
| 7,245,129 B2 | 7/2007 | Wajcer et al. |
| 7,253,640 B2 | 8/2007 | Engel et al. |
| 7,295,018 B2 | 11/2007 | Oakley |

(Continued)

OTHER PUBLICATIONS

International Search Report dated Jul. 30, 2009 for related application PCT/US2009/046921.

*Primary Examiner* — David H Malzahn
(74) *Attorney, Agent, or Firm* — Howard IP Law Group, P.C.

(57) ABSTRACT

This invention relates to a process for producing a pulsed sampled waveform comprising generating a baseband signal representing the integral of a desired output waveform; sampling and differentiating the baseband signal to produce frequency images of the baseband spectrum at multiples of the sampling rate; employing an analog bandpass filter to pass the spectral image centered at the desired up-conversion frequency band. This invention also relates to an apparatus for creating a high frequency output waveform signal comprising a means for generating a baseband signal representing the integral of a desired output waveform; a means for sampling the baseband signal; a means for generating a time delayed baseband signal by $\Delta t$; a means for inverting the delayed baseband signal; a means for summing the inverted the delayed baseband signal with the sampled baseband signal; a means for filtering to pass the high frequency signal.

14 Claims, 12 Drawing Sheets

U.S. PATENT DOCUMENTS

| | | |
|---|---|---|
| 7,298,149 B2 | 11/2007 | Saha et al. |
| 7,319,574 B2 | 1/2008 | Engel |
| 7,532,684 B2 | 5/2009 | Tietjen |
| 2001/0018334 A1 | 8/2001 | Ipek et al. |
| 2005/0001607 A1 | 1/2005 | Berland et al. |
| 2005/0009494 A1 | 1/2005 | Sorrells et al. |
| 2005/0285766 A1 | 12/2005 | San et al. |
| 2006/0181284 A1 | 8/2006 | Fraedrich |
| 2006/0273952 A1* | 12/2006 | Krikorian et al. ............. 342/198 |
| 2006/0281427 A1 | 12/2006 | Issac et al. |
| 2009/0115650 A1 | 5/2009 | Tietjen et al. |

* cited by examiner

DIFFERENTIAL INVERSE ALIASING DIGITAL TO ANALOG CONVERTER

FIELD OF INVENTION

The present invention relates to the field of converting baseband signals to a higher frequency for electronic systems applications such as radar.

BACKGROUND OF THE INVENTION

Figure 1:
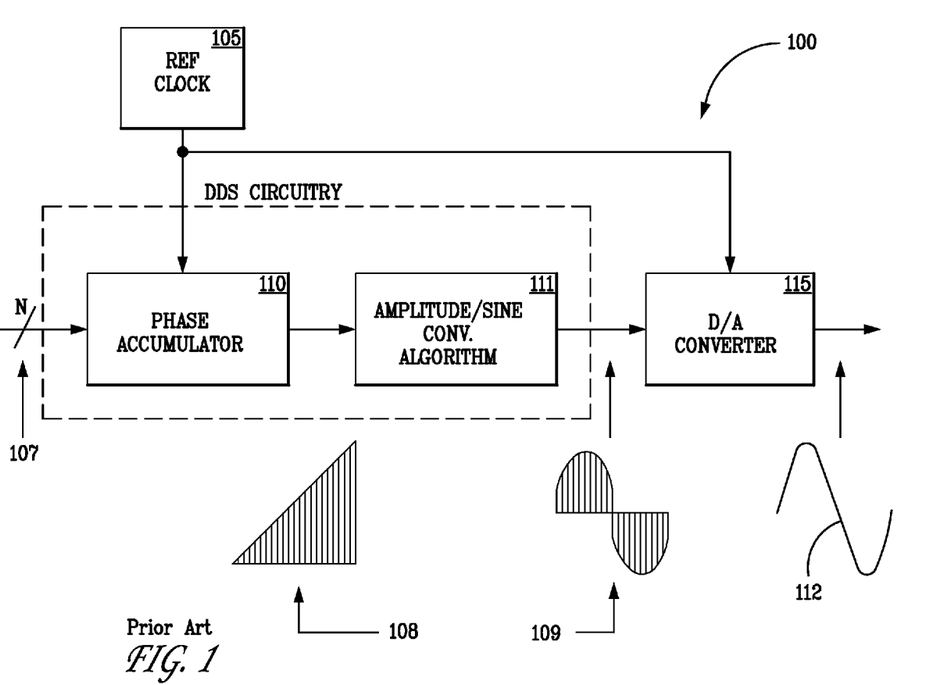
FIG. 1 illustrates a block diagram of the prior art.

Electronic signals representing video, voice, and computer baseband signals frequently requires a higher, typically RF frequency for various applications, such as RF transmission. Present techniques employ up-conversion processes that modulate higher frequency carrier signals with baseband signals (e.g., amplitude modulation, frequency modulation and phase modulation). Direct digital synthesis has also been used to up-convert baseband signals, but there are upper frequency limits associated with this. FIG. 1 is illustrative of a prior art direct digital synthesis 100 for up-converting a baseband signal. A tuning frequency is specified in a digital word 107 as a fraction of a reference frequency generated by a reference clock 105. The digital word feeds into a phase accumulator 110 and converts the accumulated phase into an analog signal using a phase to amplitude converter 111. The accumulated phase is shown as digital signal 108 and the digital phase to amplitude converted signal 109. The digital phase to amplitude converted signal 109 is converted to an analog signal 112 via D/A converter 115 to produce signal components which represent an up-converted baseband signal having the familiar (sin x)/x signal spectrum.

There is a desire to reduce complexity in the generation of high frequency RF signals by eliminating the up-converters and associated local oscillators. As mentioned direct digital synthesis generates these directly, but has upper limits on signal frequency. Other methods use baseband waveforms with modulators to up-convert to the higher frequency. It is desirable to have a solution for the generation of the higher frequencies without employing the specialized hardware and functionality associated with prior art up-converters. This would permit the use of relatively low frequency standard components for implementing the process.

SUMMARY OF THE INVENTION

The present invention relates to a process for up-converting a signal frequency comprising generating a baseband signal representing the integral of a desired output waveform; sampling and differentiating the baseband signal to produce frequency images of the baseband spectrum at multiples of the sampling rate and filtering the differentiated signal to pass a band of frequencies centered at the desired up-conversion frequency.

The step of differentiating in one embodiment of the invention includes delaying the sampled baseband signal; inverting the delayed the sampled baseband signal; and summing the inverted signal and the sampled baseband signal.

In another embodiment of the present invention a process for up-converting a signal frequency comprises generating a baseband signal representing the integral of a desired output waveform; sampling the baseband signal; generating a time delayed baseband signal by Δt; inverting the delayed baseband signal; summing the inverted the delayed baseband signal with the sampled baseband signal; and filtering to pass the desired high frequency signal.

The present invention also relates to an apparatus for creating a high frequency output waveform signal comprising a means for generating a baseband signal representing the integral of a desired output waveform; a means for sampling the baseband signal; a means for generating a time delayed baseband signal by Δt; a means for inverting the delayed baseband signal; a means for summing the inverted the delayed baseband signal with the sampled baseband signal; and a means for filtering to pass the high frequency signal.

In one aspect of the present invention a process comprises narrowing the time delay of the sampled baseband signal to reduce the attenuation normally encountered with the sin x/x envelop of staircase samples.

BRIEF DESCRIPTION OF THE DRAWINGS

Understanding of the present invention will be facilitated by consideration of the following detailed description of the preferred embodiments of the present invention taken in conjunction with the accompanying drawings, in which like numerals refer to like parts and.

DETAILED DESCRIPTION OF THE PREFERRED EMBODIMENTS

The following description of the preferred embodiments is merely by way of example and is in no way intended to limit the invention, its applications, or uses.

The present invention relates to an inverse aliasing of a differential signal to generate RF from baseband signals without the use of a modulator and reducing hardware constraints when compared to the prior art. In accordance with the present invention, relatively low frequency electronic circuit components, such as signal generators and sample and holds devices associated with baseband waveform generation can be employed.

Figure 2A:
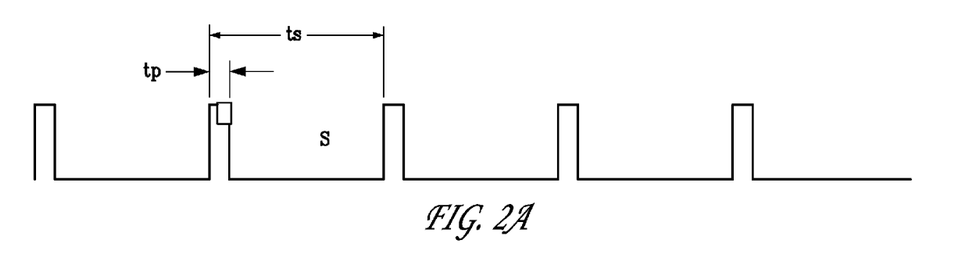
FIG. 2a illustrates an exemplar of the sampling pulse having pulse width and repetition rate.
Figure 2B:
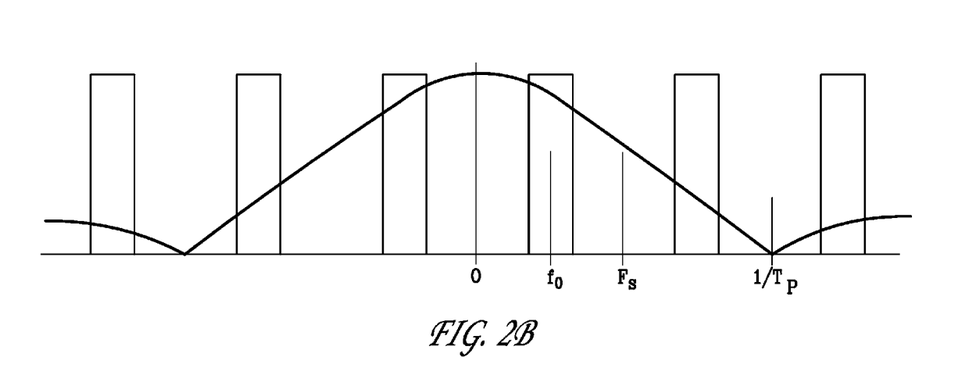
FIG. 2b illustrates an exemplar of the Fourier transform associated with a pulse train.

FIG. 2a illustrates a sampling pulse train having pulses of width $T_p$ and pulse repetition frequency $F_s$. equal to $1/T_s$. The sampling pulse samples a baseband signal to produces images of the baseband spectrum at multiples of the sampling rate. FIG. 2b illustrates a Fourier transform having a spectrum at alias multiples of the baseband that are associated with the pulse train of FIG. 2a and sampling rate of $F_s$. Delaying the baseband signal by $\Delta t$ followed by inverting the delayed baseband signal and summing the inverted delayed baseband signal with the sampled baseband signal results in aliases of the original baseband.

Figure 3A:
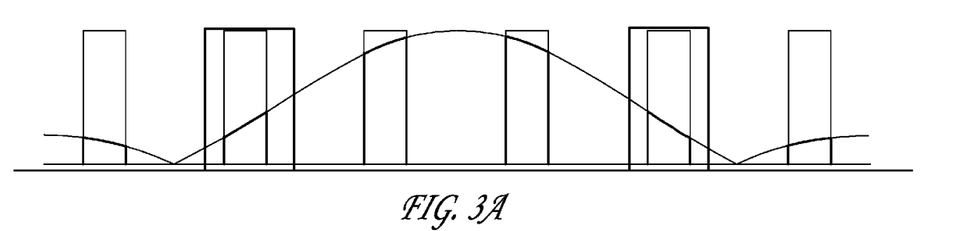
FIG. 3a illustrates a frequency spectrum following sampling according to an embodiment of the invention.
Figure 3B:
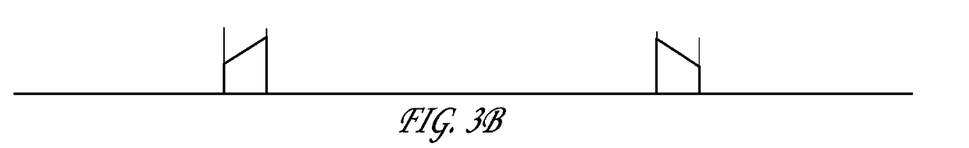
FIG. 3b illustrates a frequency spectrum of the up-converted signal according to an embodiment of the invention.

The sampled pulses in one embodiment are made narrow to a degree dependent on the application to reduce the attenuation normally encountered with the sin x/x envelopes inherent in staircase samples. An analog bandpass filter retains the spectral image centered at the desired up-conversion frequency. FIG. 3a illustrates the upsampled frequency band of interest according to an embodiment of the invention. FIG. 3b is a filtered, aliased frequency spectrum of the resulting upsampled signal according to an embodiment of the invention.

Figure 4:
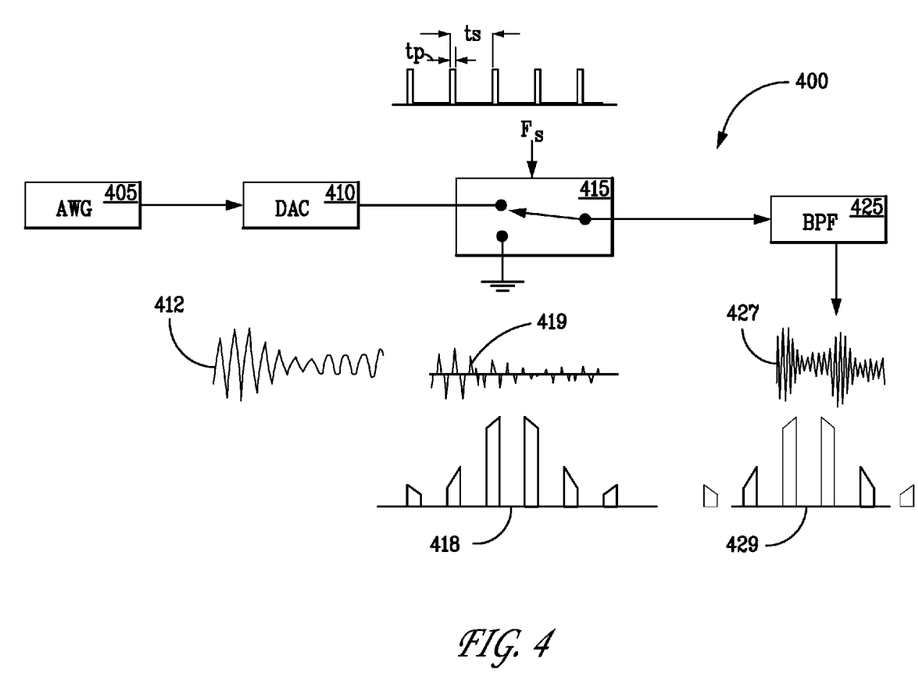
FIG. 4 illustrates a block diagram of a circuit for up-converting a baseband signal according to an embodiment of the invention.

FIG. 4 illustrates a block diagram of a circuit 400 for up-converting a baseband signal in according to an aspect of the invention. An arbitrary digital waveform generator 405 serves as input to a digital to analog converter 410 producing as by way of illustration a continuous analog signal. A switching means 415 samples the analog signal 412 at a sample rate $F_s$ that produces a sampled wave 419 containing therein aliases of the original analog signal 412 in the spectrum 418. In the example shown in FIG. 4, the switching means 415 has a sampled width $t_p$ and a sample period $1/F_s$ denoted as $T_s$. The sampled wave 419 serves as input to a bandpass filter 425 conditioned to pass the up-converted frequencies as by way of example in the signal 427 having spectrum 429.

Figure 5:
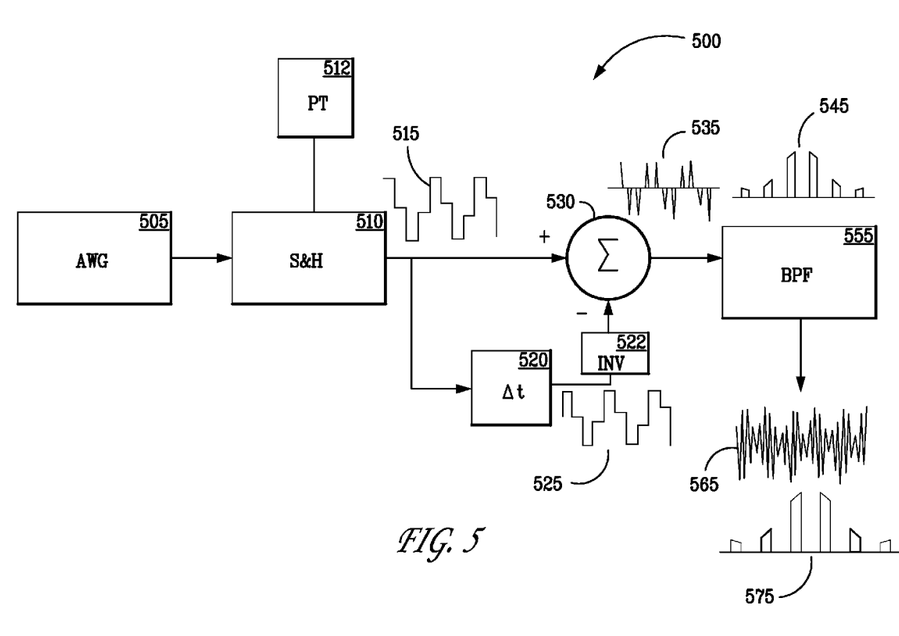
FIG. 5 illustrates a block diagram of an inverse aliasing of a differential signal generator according to an embodiment of the invention.

FIG. 5 illustrates a schematic of an inverse aliasing of a differential signal generator 500 according to an embodiment of the invention. The generator includes a means such as an arbitrary wave generator 505 for generating a baseband signal waveform representative of the integral of a desired output waveform; a means for sampling, such as by way of example a conventional sample and hold circuit 510 creating a sampled baseband signal 515; a means for generating a time delayed 520 baseband signal by $\Delta t$; a means for inverting 522 the delayed baseband signal; a means for summing 530 the inverted a delayed baseband signal 525 with a sampled baseband signal 515 to create signal 535 having a frequency spectrum 545; a means for filtering 555 the frequency spectrum 545 to pass a high frequency signal 565 having a frequency spectrum 575. The means for sampling receives a switching signal from a pulse generator 512 that serves to sample the baseband signal waveform 505. The summing amplifier has the added benefit of achieving high bandwidths without transients associated with high speed switches. Amplifiers (not shown) may used to amplify the differentiated baseband signals to compensate for the lower energy associated with the narrow pulsed samples. The aforementioned means for generating a time delayed 520, a means for inverting 522 the delayed baseband signal, means for summing the inverted a delayed baseband signal 525 with a sampled baseband signal 515, means for filtering 555 and amplifiers are comprised of circuits well know to those of ordinary skill in the art of electrical engineering.

Since as indicated above, the apparatus and process produce a pulsed sampled waveform by differentiating a baseband signal, the input into the apparatus 500 represents the integral of the desired transmitter waveform. Therefore, if the desired transmitter waveform is known, the process begins with the integral of the waveform.

Figure 6:
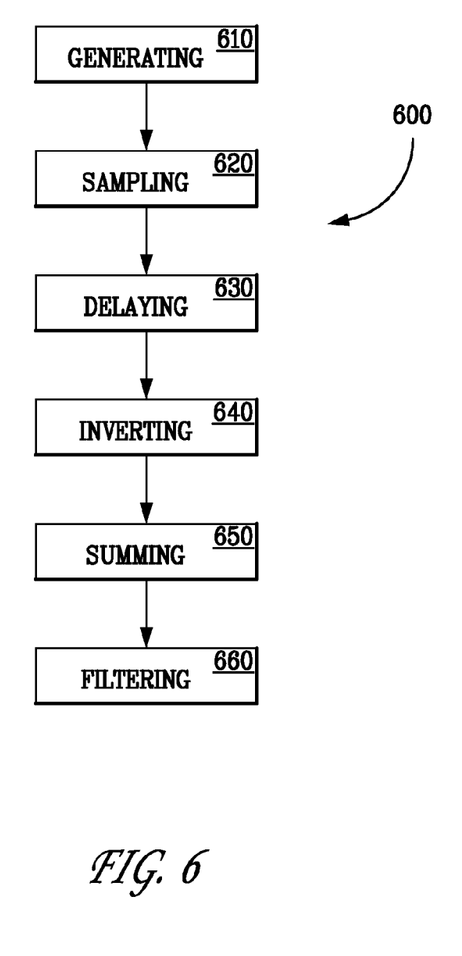
FIG. 6 illustrates a block diagram of a process for inverse aliasing of a differential signal according to an embodiment of the invention.
Figure 7A:
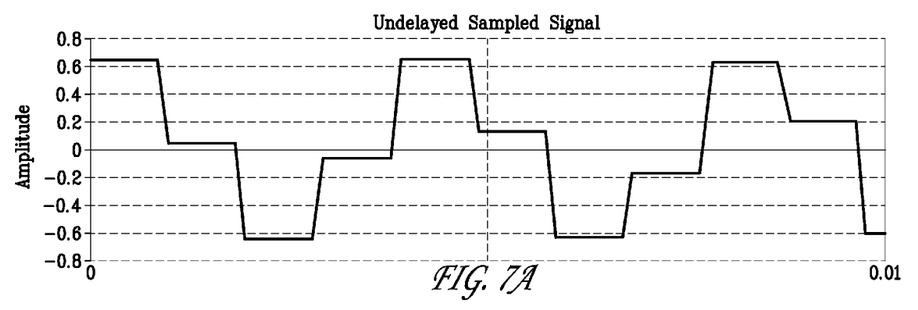
FIG. 7a illustrates a generation of an undelayed sample signal according to an embodiment of the invention.
Figure 7B:
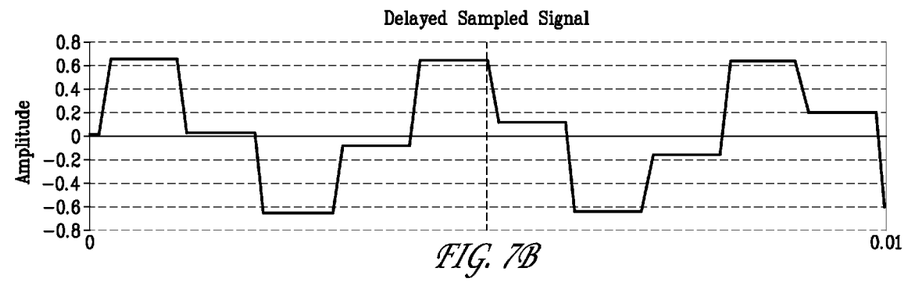
FIG. 7b illustrates a generation of a delayed sample signal according to an embodiment of the invention.
Figure 7C:
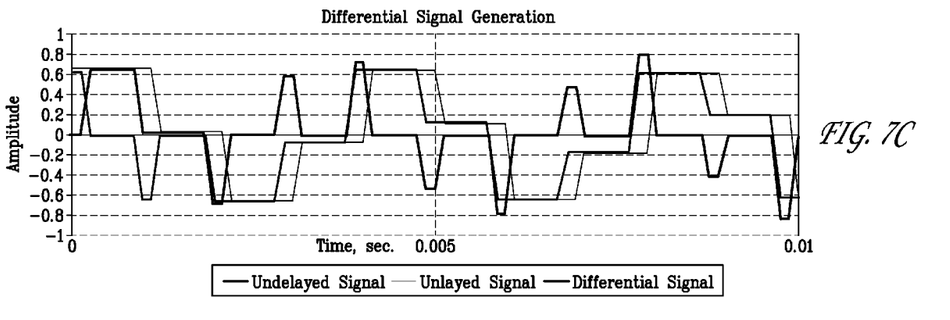
FIG. 7c illustrates a differential signal according to an embodiment of the invention.
Figure 7D:
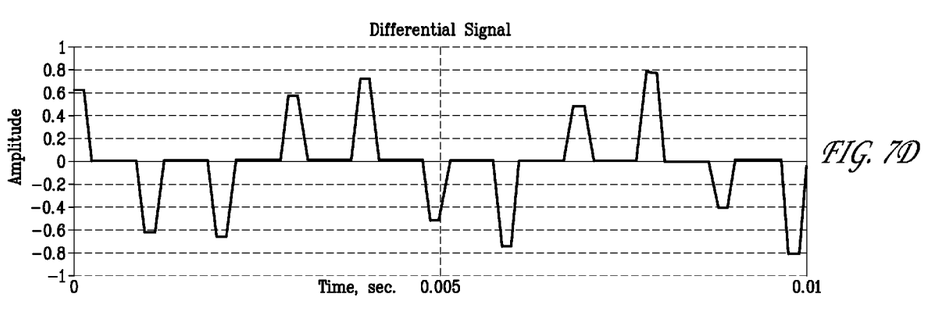
FIG. 7d illustrates a generation of a delayed sample signal according to an embodiment of the invention.

FIG. 6 illustrates a block diagram of a process 600 for inverse aliasing of a differential signal according to an embodiment of the invention. The inventive process for producing a pulsed sampled waveform comprises generating a baseband signal 610 representing the integral of a desired output waveform; sampling 620 to produce frequency images of the baseband spectrum at multiples of the sampling rate. FIG. 7a illustrates the undelayed sample signal. The differentiation of the sampled signal in one embodiment of the invention includes delaying the sampled baseband signal 630 (see, FIG. 7b), inverting 640 the delayed signal 630, and summing 650 the inverted signal with the original sampled baseband signal 630. FIG. 7c illustrates the signals shown in FIG. 7a and 7b superimposed to create the final differential signal as shown in FIG. 7d.

Figure 8:
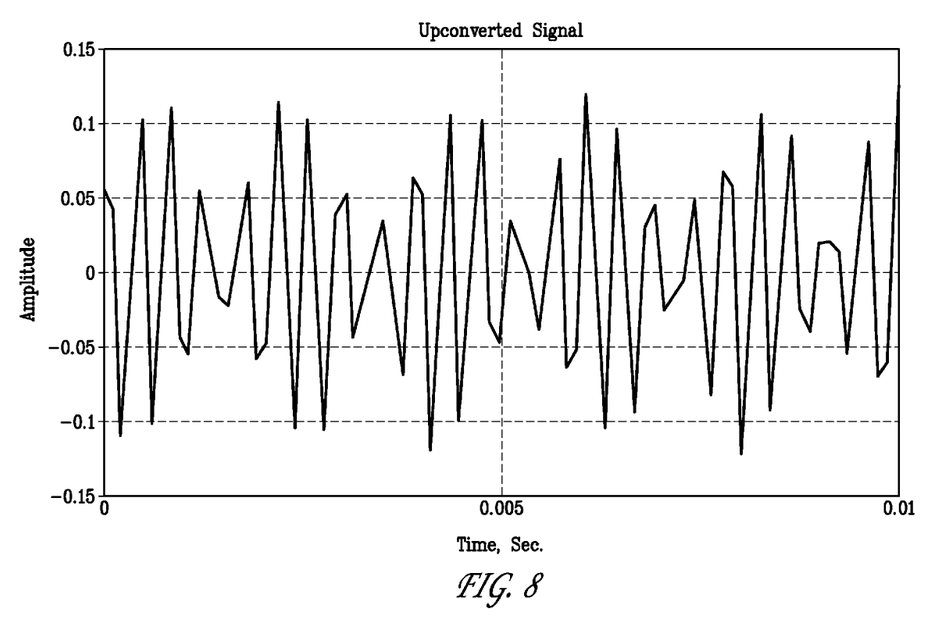
FIG. 8 illustrates a generation of an up-converted signal according to an embodiment of the invention.
Figure 9:
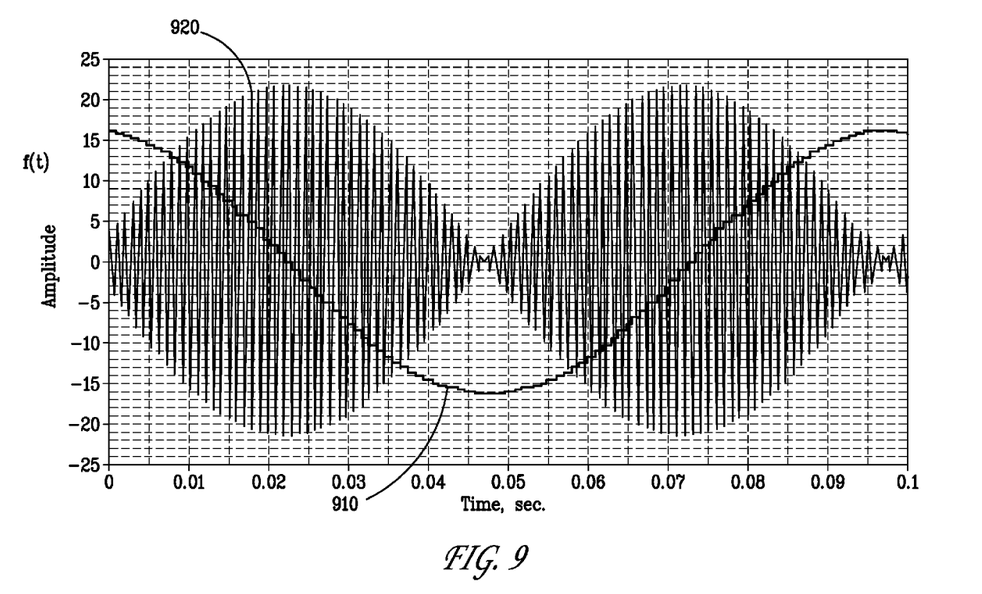
FIG. 9 illustrates a bandpass filtered up-converted signal according to an embodiment of the invention.

Differentiation is followed by filtering 660 the summed signal to create the desired waveform as shown in FIG. 8.

As indicated the inventive process 600 develops a high frequency output waveform signal based on the integral of the input waveform. Therefore by way of example, to generate an up-converted output signal 920, $f(t)=\sin(2\pi f t)$ as shown in FIG. 8, will require formation of an input signal 910 at the arbitrary wave form generator (See FIG. 5) which is the integral of the up-converted signal 920 or in this case, $f(t)=\cos(2\pi f t)/(2\pi f)$.

The present invention further relates to a process for up-converting a baseband signal comprising, integrating a baseband signal, sampling the baseband signal; time delaying the baseband signal by $\Delta t$; inverting the time delayed baseband signal; summing the inverted the time delayed baseband signal with the sampled integrated baseband signal and filtering for up-converting a baseband signal.

Figure 10A:
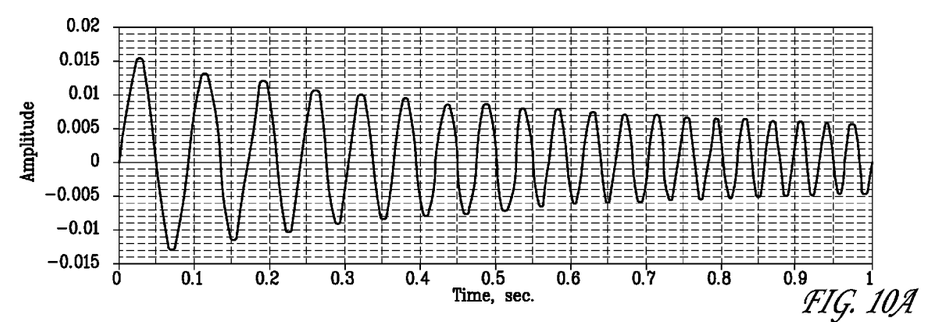
FIG. 10a illustrates integrated signals according to an embodiment of the invention.
Figure 10B:
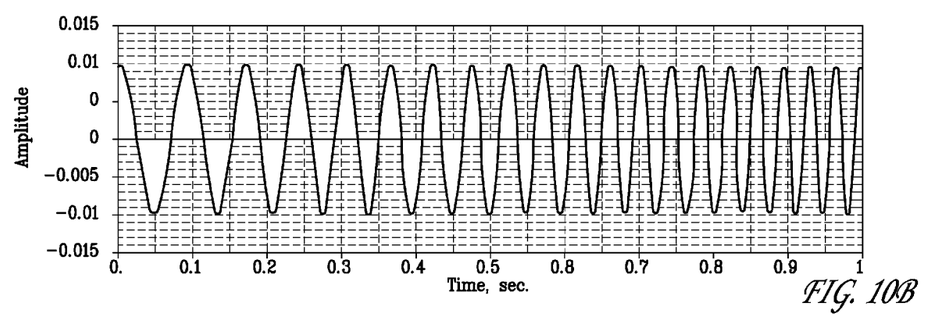
FIG. 10b illustrates differentiated signals according to an embodiment of the invention.
Figure 11:
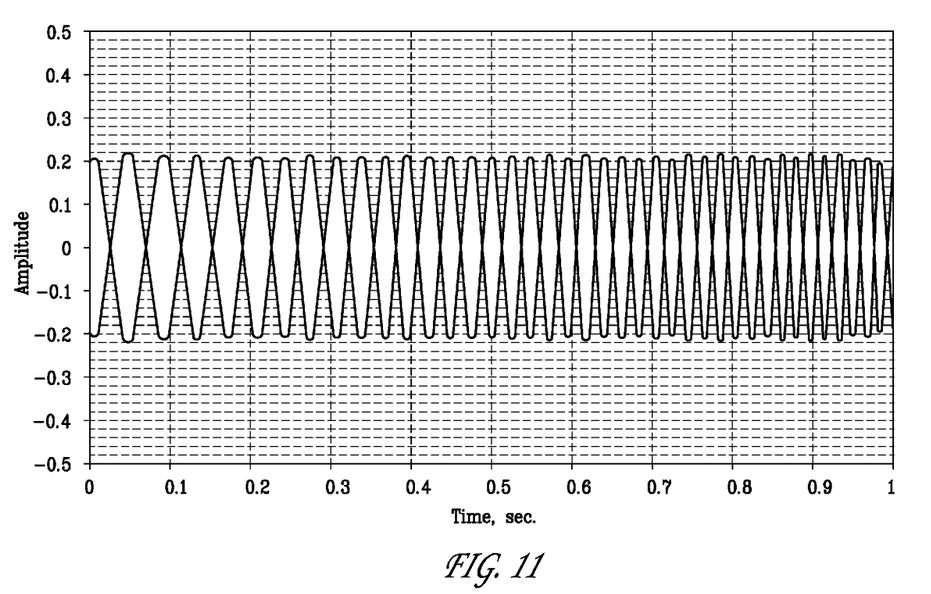
FIG. 11 illustrates a filtered up-converted signal according to an embodiment of the invention.

By way of further illustration FIG. 10a illustrates integrated input signals that are subsequently differentiated as illustrated in FIG. 10b to produce a filtered up-converted signal as illustrated in FIG. 11 according to an embodiment of the invention.

With reference to FIG. 5, it is understood that the generator 500 means for generating a baseband signal waveform 505 or generation of the pulse train that samples the means for sampling 510 can be implemented in hardware, software, firmware, or combinations thereof. In a one embodiment, the means for generating a baseband signal waveform 505 representing the integral of a desired output waveform, may be implemented in software stored in a memory. It is to be appreciated that, where the functionality selection is implemented in either software, firmware, or both, the processing instructions can be stored and transported on any computer-readable medium for use by or in connection with an instruction execution system, apparatus, or device, such as a computer-based system, processor-containing system, or other system that can fetch the instructions from the instruction execution system, apparatus, or device and execute the instructions.

Further, it is understood that aspects of the invention illustrated in FIG. 5 such as the means for generating a baseband signal waveform 505 or generation of the pulse train that samples the means for sampling 510 of the subject invention may reside in a program storage medium under the control of a computer processor. These software processes may exist in a variety of forms having elements that are more or less active or passive. For example, they may exist as software program(s) comprised of program instructions in source code or object code, executable code or other formats. Any of the above may be embodied on a computer readable medium, which include storage devices and signals, in compressed or uncompressed form. Exemplary computer readable storage devices include conventional computer system RAM (random access memory), ROM (read only memory), EPROM (erasable, programmable ROM), EEPROM (electrically erasable, programmable ROM), flash memory, and magnetic or optical disks or tapes. Exemplary computer readable signals, whether modulated using a carrier or not, are signals that a computer system hosting or running the computer program may be configured to access, including signals downloaded through the Internet or other networks. Examples of the foregoing include distribution of the program(s) on a CD ROM or via Internet download.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A method for up-converting a signal frequency comprising; generating a baseband signal representing the integral of a desired output waveform; sampling and differentiating the baseband signal to produce frequency images of the baseband spectrum at multiples of the sampling rate; and filtering the differentiated signal to pass a band of frequencies centered at the desired up-conversion frequency.

2. The method of claim 1, wherein
differentiation includes delaying the sampled baseband signal; inverting the delayed baseband signal; and summing the inverted signal and the sampled baseband signal.

3. The method of claim 1, wherein the step of generating a baseband signal representing the integral of a desired output waveform comprises integrating a baseband signal.

4. A method for creating a high frequency output waveform signal comprising:
generating a baseband signal representing the integral of a desired output waveform;
sampling the baseband signal;
generating a time delayed version of the sampled baseband signal;
inverting the delayed baseband signal; and
summing the inverted baseband signal with the sampled baseband signal.

5. The method of claim 4, further comprising the step of filtering the summed signal.

6. The method of claim 4, wherein the step of generating a baseband signal representing the integral of a desired output waveform comprises integrating a baseband signal.

7. An apparatus for up-converting a signal frequency comprising:
a means for generating a baseband signal representing the integral of a desired output waveform;
a means for sampling the baseband signal;
a means for generating a time delayed version of the baseband signal;
a means for inverting the delayed baseband signal;
a means for summing the inverted baseband signal with the sampled baseband signal; and
a means for filtering the summed signal.

8. The apparatus of claim 7, wherein the means for generating a baseband signal comprises a wave generator.

9. The apparatus of claim 7, wherein the means for sampling the baseband signal comprises a sample and hold circuit.

10. The apparatus of claim 7, wherein the means for sampling the baseband signal is responsive to a switching signal received from a pulse generator.

11. The apparatus of claim 7, wherein the means for summing the inverted baseband signal and the sampled baseband signal comprises a summing amplifier.

12. The apparatus of claim 7, wherein the means for filtering the summed signal comprises a bandpass filter.

13. An apparatus for up-converting a signal frequency comprising:
a digital waveform generator;
a digital to analog converter responsive to the output of the digital waveform generator for producing an analog signal;
a switching means for sampling the analog signal to produce a sampled wave containing therein aliases of the analog signal, and
a bandpass filter for filtering the sampled wave.

14. The apparatus of claim 13, wherein a sample rate of the switching means determines the aliases of the analog signal.

* * * * *